United States Patent
Ohkubo

(10) Patent No.: US 8,409,349 B2
(45) Date of Patent: Apr. 2, 2013

(54) FILM THICKNESS MEASUREMENT METHOD, EPITAXIAL WAFER PRODUCTION PROCESS AND EPITAXIAL WAFER

(75) Inventor: Kazuhiro Ohkubo, Tokyo (JP)

(73) Assignee: Sumco Corporation, Tokyo (JP)

( * ) Notice: Subject to any disclaimer, the term of this patent is extended or adjusted under 35 U.S.C. 154(b) by 967 days.

(21) Appl. No.: 12/480,921

(22) Filed: Jun. 9, 2009

(65) Prior Publication Data

US 2009/0305021 A1    Dec. 10, 2009

(30) Foreign Application Priority Data

Jun. 10, 2008  (JP) ................................. 2008-151858

(51) Int. Cl.
*H01L 21/322* (2006.01)
*C30B 23/00* (2006.01)
*C30B 25/00* (2006.01)
*C30B 28/12* (2006.01)
*C30B 28/14* (2006.01)
*C30B 35/00* (2006.01)

(52) U.S. Cl. ................ 117/85; 117/2; 117/84; 117/106; 117/107; 117/200

(58) Field of Classification Search ................ 117/2, 84, 117/85, 106, 107, 200
See application file for complete search history.

(56) References Cited

U.S. PATENT DOCUMENTS

| 6,596,095 | B2 * | 7/2003 | Ries et al. ..................... 148/33.1 |
| 7,142,314 | B2 * | 11/2006 | Nguyen et al. ................. 356/620 |
| 2009/0127672 | A1 * | 5/2009 | Kinbara ........................ 257/652 |
| 2009/0205562 | A1 * | 8/2009 | Wada .............................. 117/84 |
| 2009/0305021 | A1 * | 12/2009 | Ohkubo ......................... 428/220 |

FOREIGN PATENT DOCUMENTS

| JP | 2003-109991 | 4/2003 |
| JP | 2003-254741 | 9/2003 |
| JP | 10-275776 | 10/2008 |

OTHER PUBLICATIONS

Carpio et al., SPIE vol. 2638 p. 72-83.*
U.S. Appl. No. 12/497,835 to Naoyuki Wada, which was filed on Jul. 6, 2009.
Korean Office action that issued with respect to patent family member Korean Patent Applicatiuon No. 10-2009-0049734, dated Dec. 6, 2011 along with an english translation thereof.

* cited by examiner

*Primary Examiner* — James McDonough
(74) *Attorney, Agent, or Firm* — Greenblum & Bernstein, P.L.C.

(57) ABSTRACT

A film thickness measurement method for measuring a change in film thickness of 0.3 μm or less in a silicon wafer by FTIR, having an auxiliary film formation step for depositing an auxiliary film for measurement on a surface to be measured for the change in film thickness, an auxiliary film thickness measurement step for measuring the film thickness of the auxiliary film, a measurement step for measuring the film thickness of the auxiliary film after the change in film thickness, and a calculation step for calculating a change in film thickness of a back surface deposit from the result of the measurement step and the result of the auxiliary film thickness measurement step.

8 Claims, 6 Drawing Sheets

FILM THICKNESS MEASUREMENT METHOD, EPITAXIAL WAFER PRODUCTION PROCESS AND EPITAXIAL WAFER

TECHNICAL FIELD

The present invention relates to a film thickness measurement method, an epitaxial wafer production process, and an epitaxial wafer and more particularly, to a production preferably used to produce an epitaxial wafer capable of accommodating back surface deposition.

The present application claims priority on the basis of Japanese Patent Application No. 2008-151858 filed in Japan on Jun. 10, 2008, the contents of which are incorporated herein by reference.

BACKGROUND ART

One of the problems of the production of epitaxial wafers in which an epitaxial layer is deposited on the surface of a silicon single crystal wafer is the formation of a back surface deposit. Namely, the back surface of a silicon wafer made to undergo epitaxial growth in an epitaxial reactor is partially supported on a wafer support platform referred to as a susceptor. Consequently, reaction gas supplied to the epitaxial reactor during epitaxial growth may circulate to the back surface of the silicon wafer at those portions where the back surface and susceptor are not in contact.

Reaction gas that has circulated to the back surface in this manner causes epitaxial growth or polysilicon growth not only on the surface of the silicon wafer but on the back surface as well, causing a film to be deposited on the back surface of the wafer as well and resulting in the formation of a so-called back surface deposit (paragraph [0010] of Japanese Unexamined Patent Application, First Publication No. H10-275776).

Such back surface deposits may be extremely thin, having a thickness of, for example, 0.04 µm.

In addition, film thickness of an epitaxial layer of a silicon wafer is typically measured by Fourier Transform Infrared (FTIR) measurement. This method consists of measuring film thickness of an epitaxial layer based on the difference in the concentrations of impurities between the wafer and the epitaxial layer as determined with an infrared beam radiated onto the wafer surface (paragraph [0002] of Japanese Unexamined Patent Application, First Publication No. 2003-109991).

DISCLOSURE OF THE INVENTION

Problems to be Solved by the Invention

However, in the case of measuring film thickness of an epitaxial film by FTIR, the lower limit of film thickness capable of being measured by FTIR is 0.3 µm due to the considerable effect of reflection from the surface of the epitaxial layer. Thus, there was the problem of being unable to measure film thickness of a back surface deposit formed on the back surface of an epitaxial wafer by FTIR since it is extremely thin at only 0.04 µm.

With the foregoing in view, the present invention attempts to achieve the following objects:
1. measurement of film thickness of back surface deposits;
2. elimination of variations in flatness caused by back surface deposits;
3. discrimination of epitaxial wafers unaffected by back surface deposits; and
4. supplying of epitaxial wafers unaffected by back surface deposits.

Means for Solving the Problems

The film thickness measurement method of the present invention is a film thickness measurement method for measuring a change in film thickness of 0.3 µm or less in a silicon wafer by FTIR, comprising:
an auxiliary film formation step for depositing an auxiliary film for measurement of a prescribed film thickness on a side to be measured for the change in film thickness;
an auxiliary film thickness measurement step for measuring the film thickness of the auxiliary film;
a measurement step for measuring the film thickness of the auxiliary film after the change in film thickness; and
a calculation step for calculating a change in film thickness from the result of the measurement step and the result of the auxiliary film thickness measurement step,
thereby solving the aforementioned problems.

The film thickness measurement method of the present invention is such that in the film thickness measurement method as described above, a change in film thickness measured in the measurement step can be defined as a change in film thickness caused by a back surface deposit on the back surface of a wafer in a front surface epitaxial layer formation step in which an epitaxial layer is formed on the front surface of the wafer during production of an epitaxial wafer.

The epitaxial wafer production process of the present invention is an epitaxial wafer production process in which an epitaxial layer is deposited on the front surface of a wafer, comprising:
an auxiliary film formation step for depositing an auxiliary film for measurement of a prescribed film thickness on the back surface of the wafer;
an auxiliary film thickness measurement step for measuring the film thickness of the auxiliary film by FTIR;
a front surface epitaxial layer deposition step for depositing an epitaxial layer on the front surface of the wafer;
a measurement step for measuring the film thickness of the auxiliary film caused by a back surface deposit on the auxiliary film by FTIR after the front surface epitaxial layer deposition step; and
a calculation step for calculating a change in film thickness of 0.3 µm or less caused by the back surface deposit from the result of the measurement step and the result of the auxiliary film thickness measurement step.

In addition, in the present invention, in the epitaxial wafer production process as described above, a means can be employed by which measurement of a change in film thickness in the measurement step is only carried out at the peripheral edge of the wafer over a range of 1 to 10 mm in the direction of diameter from the peripheral edge.

In addition, in the epitaxial wafer production process described above,
measurement of a change in film thickness in the measurement step can be carried out in the circumferential direction of the wafer at a central angle pitch of 15°.

In the present invention, an evaluation step is preferably provided for evaluating the acceptability of epitaxial wafers according to a change in film thickness caused by a back surface deposit obtained by any of the previously described epitaxial wafer production processes.

In the epitaxial wafer of the present invention, the epitaxial wafer is preferably produced according to the previously described epitaxial wafer production process.

The film thickness measurement method of the present invention is a film thickness measurement method for measuring a change in film thickness of 0.3 μm or less in a silicon wafer by FTIR, comprising:

an auxiliary film formation step for depositing an auxiliary film for measurement of a prescribed film thickness on a side to be measured for the change in film thickness;

an auxiliary film thickness measurement step for measuring the film thickness of the auxiliary film;

a measurement step for measuring the film thickness of the auxiliary film after the change in film thickness; and a calculation step for calculating a change in film thickness from the result of the measurement step and the result of the auxiliary film thickness measurement step.

As a result of having these steps, film thickness that has changed by 0.3 μm or less (change in film thickness of 0.3 μm or less), which was unable to be measured by conventional FTIR, can be obtained by depositing in advance an auxiliary film by epitaxial growth over the entire region of a change in film thickness where a change in film thickness occurs in a measured portion thereof, measuring the film thickness of the auxiliary film only, simultaneously measuring the film thickness of a portion where film thickness has changed and the film thickness of the auxiliary film after the change in film thickness has occurred in the form of the combined thickness thereof, and determining the change in film thickness by subtracting the film thickness of the auxiliary film only from this combined film thickness.

At this time, it is necessary that the silicon wafer and the auxiliary film have a difference in impurity concentrations thereof capable of being detected by FTIR.

When a silicon auxiliary film has been formed by epitaxial growth on the surface of a silicon single crystal wafer, measurement of the thickness (film thickness) of the auxiliary film is carried out by, for example, the Fourier Transform Infrared (FTIR) method.

FIG. 3 is a schematic drawing for explaining measurement of film thickness by FTIR in the present invention.

As shown in FIG. 3, FTIR refers to a method for detecting a film thickness Ta of an auxiliary film A by radiating infrared light L1 onto the main surface of a wafer having the auxiliary film A formed by epitaxial growth on a polished wafer (substrate) PW obtained from a silicon single crystal pulled from a silicon melt according to the Czochralski method by going through steps such as slicing, lapping, grinding, etching and polishing, guiding reflected light L2 reflected at the surface SA of the auxiliary film A and reflected light L3 reflected at the interface (boundary) between the auxiliary film A and the substrate PW into a detector (not shown), and measuring the difference in the light paths thereof.

In this FTIR method, since it is necessary to reflect light at the interface S2 between the substrate PW and the auxiliary film A, a difference in impurity concentration is normally set between the substrate PW and the auxiliary film A.

More specifically, the substrate PW is preferably doped to a high concentration of impurities of about $5 \times 10^{17}$ atoms/cm$^3$ or more. In addition, the concentration of impurities in the auxiliary film A can be made to be a low concentration of, for example, about $1 \times 10^{15}$ atoms/cm$^3$.

Here, an example of an impurity in the case of a p-type wafer is B, while examples of impurities in the case of an N-type wafer include P, As and Sb.

More specifically, the substrate PW may be of the p++ type or p+ type, while the auxiliary film A can be of the p− type.

Here, the p++ type refers to a substrate having an impurity concentration of about $10^{19}$ atoms/cm$^3$ and a low resistance value of 10 (mΩ·cm) or less, the p+ type refers to a substrate having an impurity concentration of about $10^{18}$ atoms/cm$^3$ and a resistance value of about 10 to 100 (mΩ·cm), and the p− type refers to an auxiliary film having an impurity concentration of about $10^{15}$ atoms/cm$^3$ and a resistance value of 0.1 (Ω·cm) or more.

Measurement according to the FTIR method is also carried out in the same manner as measurement of film thickness of the auxiliary film described above when simultaneously measuring the film thickness of a portion in which film thickness has changed and the film thickness of the auxiliary film after a change in film thickness has occurred in the form of a combined film thickness.

FIG. 4 is a schematic drawing for explaining measurement of film thickness of a portion where film thickness has changed using the FTIR method in the present invention.

When simultaneously measuring the film thickness of a portion where film thickness has changed and the film thickness of the auxiliary film after a change in film thickness has occurred in the form of a combined film thickness, measurement is carried out according to the FTIR method in the same manner as measurement of film thickness of the auxiliary film as described above.

Namely, as shown in FIG. 4, the method for measuring combined film thickness by FTIR consists of radiating infrared light L1 in the vicinity of the occurrence of a portion R where film thickness has changed on the polished wafer (substrate) PW on which the auxiliary film A has been formed, guiding reflected light L4, reflected at the surface SR of the portion R where film thickness has changed on the auxiliary film A, and reflected light L5, reflected at the interface (boundary) S2 between the auxiliary film A and the substrate PW, into a detector (not shown), and detecting the film thickness Ta of the auxiliary film A and the film thickness Tr of the portion R where film thickness has changed in the form of a combined film thickness Tra by measuring the difference in their light paths.

Subsequently, in the calculation step, the film thickness Tr of the portion R where film thickness has changed is calculated as the difference between the combined film thickness Tra and the film thickness Ta of the auxiliary film A. Namely, film thickness Tr is calculated as follows.

$$Tr = Tra - Ta \qquad (1)$$

The film thickness measurement method of the present invention is such that in the film thickness measurement method as described above, by defining a change in film thickness measured in the measurement step as a change in film thickness caused by a back surface deposit on the back surface of a wafer in a front surface epitaxial layer formation step in which an epitaxial layer is deposited on the front surface of the wafer during production of an epitaxial wafer, forming in advance an auxiliary film by epitaxial growth on the back surface of a wafer where a back surface deposit has occurred on a wafer on which an epitaxial layer is formed to serve as a device region, and measuring the film thickness of only the auxiliary film prior to the epitaxial layer deposition step, the value of a change in film thickness of 0.3 μm or less caused by a back surface deposit, which was unable to be measured by conventional FTIR, can be accurately obtained by simultaneously measuring the film thickness of the back surface deposit that occurred after depositing the epitaxial layer and the film thickness of the auxiliary film only in the form of a combined film thickness, and then subtracting the film thickness of the auxiliary film only from this combined film thickness.

Here, the impurity concentration of the auxiliary film is preferably set to a concentration equal to or roughly equal to the impurity concentration of the back surface deposit, namely the set impurity concentration of the epitaxial layer formed on the front surface of the wafer, and when simultaneously measuring the film thicknesses of the back surface deposit and the auxiliary film in the form of a combined film thickness, this means that the impurity concentration of the auxiliary film is set to an impurity concentration within a range that does not cause reflection of infrared light in the FTIR method at the interface (boundary) between the measurement targets in the form of the back surface deposit and auxiliary film.

In addition, the film thickness of the preliminarily formed auxiliary film is preferably about 0.3 to 5 μm and more preferably about 1 to 3 μm, or 2 μm. If the film thickness of the auxiliary film is below this range, there is the possibility of measurement of combined film thickness by the FTIR method not being carried out accurately, thereby making this undesirable, while if the film thickness of the auxiliary film exceeds this range, in addition to increasing the amount of time required for the auxiliary film formation step, the amount of deposition gas required for depositing the auxiliary film also increases, which together with causing poor work efficiency, causes an increase in required costs, thereby making this undesirable.

Here, an explanation is provided of the detection limit of film thickness by FTIR being about 0.3 μm.

FIGS. 5 and 6 are graphs showing the results of measurement of film thickness of an epitaxial layer by FTIR in the present invention.

As shown in FIG. 5, in the measurement result for the difference in light paths as determined by FTIR, the portion indicating the location of the outermost surface SA is large, while the interface S2 between the epitaxial layer and the substrate is small. Moreover, as shown in FIG. 6, in the vicinity of the outermost surface SA, the measurement result for the inside is affected by reflection from the outermost surface SA to a depth of 0.3 μm, and as a result, the location of the interface where a difference in impurity concentrations exists cannot be accurately detected. Thus, the detection limit of film thickness by the FTIR method is 0.3 μm.

The epitaxial wafer production process of the present invention is an epitaxial wafer production process in which an epitaxial layer is deposited on the front surface of a wafer, comprising:

an auxiliary film formation step for depositing an auxiliary film for measurement of a prescribed film thickness on the back surface of the wafer;

an auxiliary film thickness measurement step for measuring the film thickness of the auxiliary film by FTIR;

a front surface epitaxial layer deposition step for depositing an epitaxial layer on the front surface of the wafer;

a measurement step for measuring the film thickness of the auxiliary film caused by a back surface deposit on the auxiliary film by FTIR after the front surface epitaxial layer deposition step; and a calculation step for calculating a change in film thickness of 0.3 μm or less caused by the back surface deposit from the result of the measurement step and the result of the auxiliary film thickness measurement step.

As a result of having these steps, by forming an auxiliary film by epitaxial growth on the back surface of a wafer on which back surface deposit has occurred on a wafer on which an epitaxial layer is formed to serve as a device region and measuring the film thickness of only the auxiliary film prior to the epitaxial layer deposition step, the value of a change in film thickness of 0.3 μm or less caused by a back surface deposit, which was unable to be measured by conventional FTIR, can be accurately obtained by simultaneously measuring the film thickness of the back surface deposit that occurred after depositing the epitaxial layer and the film thickness of the auxiliary film only in the form of a combined film thickness, and then subtracting the film thickness of the auxiliary film only from this combined film thickness.

FIG. 4 is a schematic drawing for explaining measurement of the change in film thickness of a back surface deposit by FITR in the present invention.

When simultaneously measuring the film thickness of a back surface deposit (portion where film thickness has changed) that has occurred after depositing the epitaxial layer and the film thickness of the auxiliary film in the form of a combined film thickness, measurement is carried out according to the FTIR method in the same manner as the previously described film thickness measurement method.

Namely, as shown in FIG. 4, in a wafer having an epitaxial layer E serving as a device region formed by epitaxial growth on a surface S1 of a polished wafer (substrate) PW in which the auxiliary film A is formed on the back surface S2, the method for measuring combined film thickness by FTIR consists of radiating infrared light L1 onto the peripheral edge F of the wafer back surface S2 where a back surface deposit occurs, guiding reflected light L4, reflected at the surface SR of the back surface deposit R on the auxiliary film A, and reflected light L5 reflected at the interface (boundary) S2 between the auxiliary film A and the substrate PW, into a detector (not shown), and detecting the film thickness Ta of the auxiliary film A and the film thickness Tr of the back surface deposit R in the form of a combined film thickness Tra by measuring the difference in their light paths.

Subsequently, in the calculation step, the film thickness Tr of the back surface deposit R is calculated as the difference between the combined film thickness Tra and the film thickness Ta of the auxiliary film A. Namely, film thickness Tr is calculated as follows.

$$Tr = Tra - Ta \tag{1}$$

In addition, in the present invention, in the epitaxial wafer production process as described above, as a result of carrying out measurement of a change in film thickness in the measurement step only at the peripheral edge of the wafer within a range of 1 to 10 mm from the peripheral edge in the direction of diameter, in addition to being able to shorten work time required for the measurement step by measuring only the peripheral edge of the wafer where there is the possibility of the occurrence of a back surface deposit, the occurrence of a back surface deposit can be reliably detected. At this time, measurement of film thickness of the auxiliary film in the auxiliary film thickness measurement step is also preferably carried out only at the peripheral edge of the wafer as described above, thereby making it possible to shorten work time required for the auxiliary film thickness measurement step.

In addition, in the epitaxial wafer production process as described above, as a result of carrying out measurement of a change in film thickness in the measurement step at a central angle pitch of 15° in the circumferential direction of the wafer, in addition to being able to achieve a detection accuracy capable of adequately predicting the effect of a back surface deposit in the subsequent step in the form of the device step, the work time required for the measurement step can be shortened, thereby making it possible to shorten the total amount of time and reduce costs of epitaxial wafer production.

Here, as shown in FIG. 7, a central angle pitch of 15° refers to an angle resulting from viewing a measurement point P on the peripheral edge of the wafer from the center of the wafer that is set every 15°. As a result, in an epitaxial wafer having a diameter of 300 mm, the required measurement of back surface deposits can be carried out at locations corresponding to each device with respect to the production of devices measuring 20 to 30 mm on a side and preferably 25 mm on a side.

At this time, measurement of film thickness of the auxiliary film in the auxiliary film thickness measurement step is preferably also carried out only at the central angle pitch described above, thereby making it possible to shorten the work time required for the auxiliary film thickness measurement step.

In the present invention, by having an evaluation step for evaluating the acceptability of an epitaxial wafer according to a change in film thickness caused by a back surface deposit obtained by any of the previously described epitaxial wafer production processes, wafers in which the film thickness Tr of a back surface deposit was calculated according to the aforementioned formula (1) can preferably be judged to be unacceptable if the value of Tr is 0.04 µm or more and acceptable if less than this value, and more preferably judged to be unacceptable if the value of Tr is 0.02 µm or more and acceptable if less than this value. Furthermore, although varying according to the device to which it is applied, the film thickness Tr of a back surface deposit used to evaluate whether an epitaxial wafer is acceptable or unacceptable can be set within the range of 0.01 to 0.2 µm.

In the epitaxial wafer of the present invention, an epitaxial wafer in which the effects of a back surface deposit are reduced can be produced by being produced according to the epitaxial wafer production process described above.

EFFECTS OF THE INVENTION

According to the present invention, the effect is demonstrated in which film thickness that has changed (change in film thickness) by 0.3 µm or less, which was unable to be measured by conventional FTIR, can be measured by forming in advance an auxiliary film by epitaxial growth over the entire surface of a measured portion of a wafer where a change in film thickness occurs, measuring the film thickness of this auxiliary film only, simultaneously measuring the film thickness of the portion where film thickness has changed after the occurrence of a change in film thickness and the film thickness of the auxiliary film in the form of a combined film thickness, and then determining the change in film thickness by subtracting the film thickness of the auxiliary film only from the combined film thickness.

BEST MODE FOR CARRYING OUT THE INVENTION

The following provides an explanation of the film thickness measurement method, epitaxial wafer production process, and an embodiment of an epitaxial wafer as claimed in the present invention based on the drawings.

Figure 1:
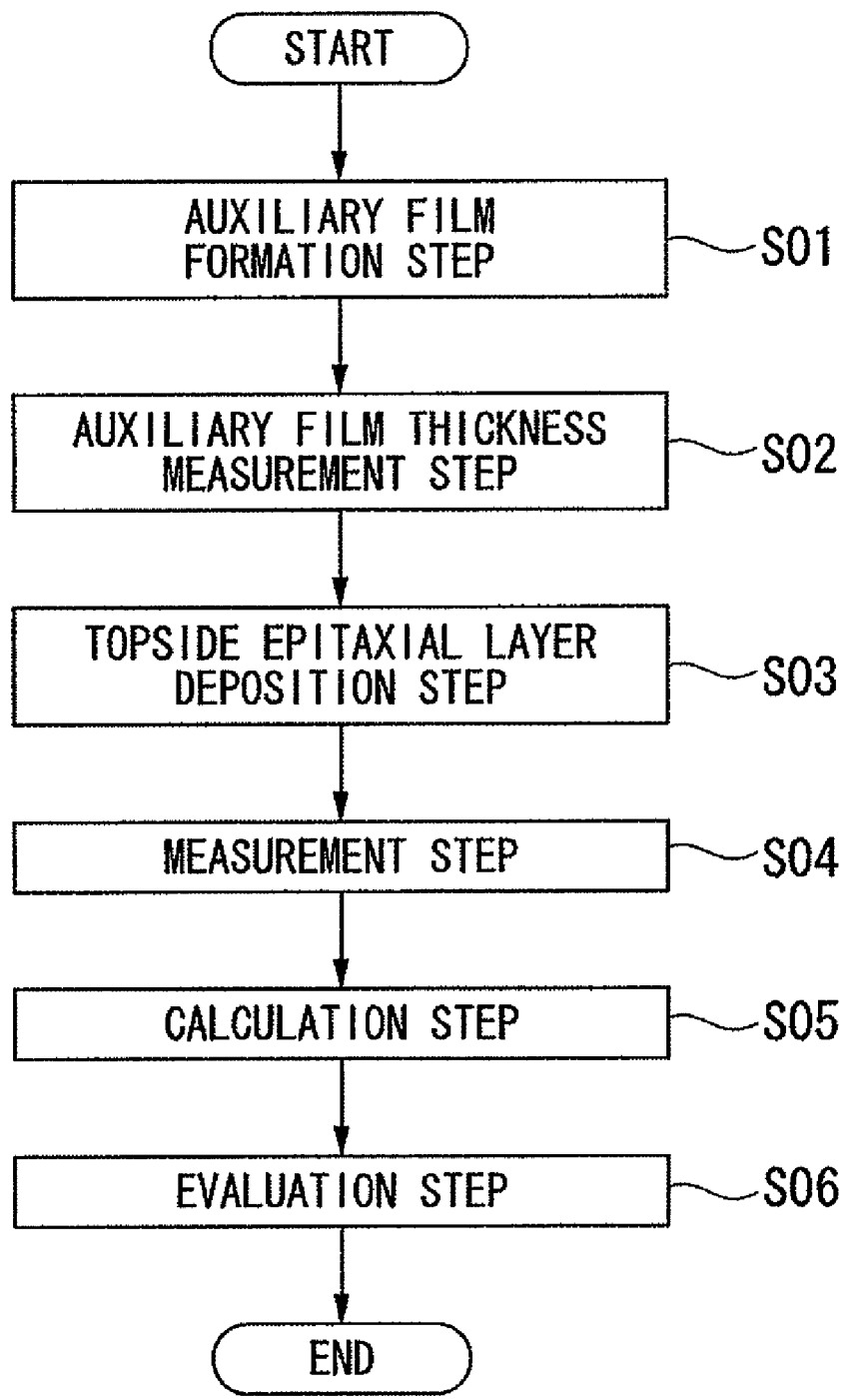
FIG. 1 is a flow chart showing one example of the film thickness measurement method and epitaxial wafer production process as claimed in the present invention.

FIG. 1 is a flow chart showing the film thickness measurement method and epitaxial wafer production process in the present embodiment, while FIG. 2 is a schematic cross-sectional view showing a wafer in each step. In the drawings, the reference symbol "W" indicates a wafer.

In the film thickness measurement method of the present embodiment, measurement of film thickness of a back surface deposit occurring during production of an epitaxial wafer is carried out using for the measured portion a portion where film thickness changes, and this is explained in the form of an epitaxial wafer production process.

The epitaxial wafer production process of the present embodiment is an epitaxial wafer production process in which an epitaxial layer is deposited on the front surface of a wafer, and as shown in FIG. 1, comprises an auxiliary film formation step S01 for depositing an auxiliary film for measurement having a prescribed film thickness on the back surface of the wafer, an auxiliary film thickness measurement step S02 for measuring the film thickness of the auxiliary film by FTIR, a front surface epitaxial layer deposition step S03 for depositing an epitaxial layer on the front surface of the wafer, a measurement step S04 for measuring the film thickness of the auxiliary film caused by a back surface deposit on the auxiliary film by FTIR after the front surface epitaxial layer deposition step, a calculation step S05 for calculating a change in film thickness of 0.3 µm or less caused by the back surface deposit from the result of the measurement step and the result of the auxiliary film thickness measurement step, and an evaluation step S06 for evaluating the acceptability of the epitaxial wafer according to the resulting change in film thickness caused by the back surface deposit.

Figure 2A:
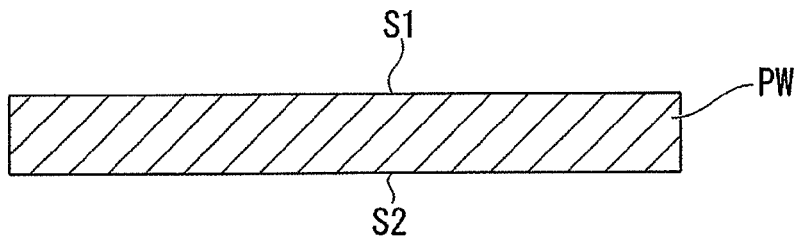
FIG. 2 is a schematic cross-sectional view showing a wafer in each step of FIG. 1.

First, as shown in FIG. 2A, a polished wafer (substrate) PW is prepared that is obtained from a silicon single crystal pulled from a silicon melt according to the Czochralski method by going through steps such as slicing, lapping, grinding, etching and polishing. Here, the polished wafer PW may be a single-sided polished wafer of which at least the front surface S1, on which an epitaxial layer to serve as a device region is deposited, is polished. In the present embodiment, the polished wafer PW is a double-sided polished wafer of which both the front surface S1 and the bottom side S2 are polished.

Here, the polished wafer PW, in the case of a p-type wafer, for example, has an impurity concentration enabling detection of the interface by FTIR, is preferably doped with an impurity in the form of boron to a high concentration of about $5 \times 10^{17}$ atoms/cm$^3$, and may be of a p++ type or a p+ type.

Here, the p++ type refers to that having a boron concentration of about $10^{19}$ atoms/cm$^3$ and a low resistance value of 10 (mΩ·cm) or less, while the p+ type refers to that having a boron concentration of about $10^{18}$ atoms/cm$^3$ and a resistance value of about 10 to 100 (mΩ·cm).

Figure 2B:
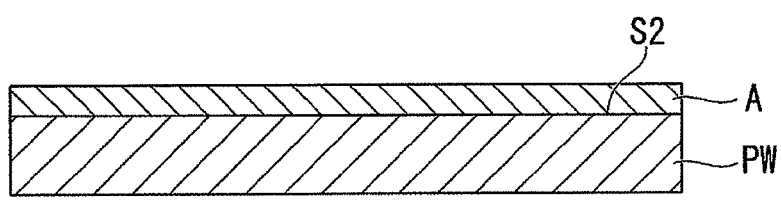

In the auxiliary film formation step S01, as shown in FIG. 2B, the auxiliary film A for measurement is deposited by epitaxial growth on the back surface S2 of the polished wafer PW.

In addition to containing the same type of impurity as an epitaxial layer E to be described later, this auxiliary film A is set to about the same impurity concentration, or contains the same type of impurity as the polished wafer PW but at a different concentration. The impurity concentration of the auxiliary film A enables detection of the interface by FTIR, and the auxiliary film A may be of the p– type doped to a low concentration of, for example, $1 \times 10^{15}$ atoms/cm$^3$. Here, a p–type refers to that having a boron concentration of about $10^{15}$ atoms/cm$^3$ and a resistance value of 0.1 (Ω·cm) or more.

In addition, the film thickness Ta of the auxiliary film A preliminarily formed in the auxiliary film formation step S01 is preferably about 0.3 to 5 μm, more preferably about 1 to 3 μm and specifically about 2 μm. If the film thickness of the auxiliary film A is below this range, there is the possibility of measurement of combined film thickness Tra not being measured accurately by FTIR to be described later, thereby making this undesirable, while if the film thickness of the auxiliary film A is above this range, together with the time required for the auxiliary film formation step S01 increasing, the amount of deposition gas and the like required for deposition of the auxiliary film also increases, which together with causing poor work efficiency, also increases costs, thereby making this undesirable.

When depositing the auxiliary film A, using a batch-type single-wafer epitaxial reactor at a heating temperature of 1130° C., a raw material gas in the form of trichlorosilane and a dopant gas in the form of diborane ($B_2H_6$) are passed over the back surface of the polished wafer PW installed in the single-wafer epitaxial reactor together with a carrier gas in the form of hydrogen for a prescribed amount of time.

Figure 2C:
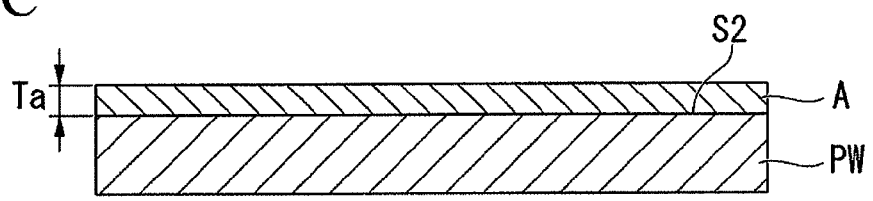
Figure 3:
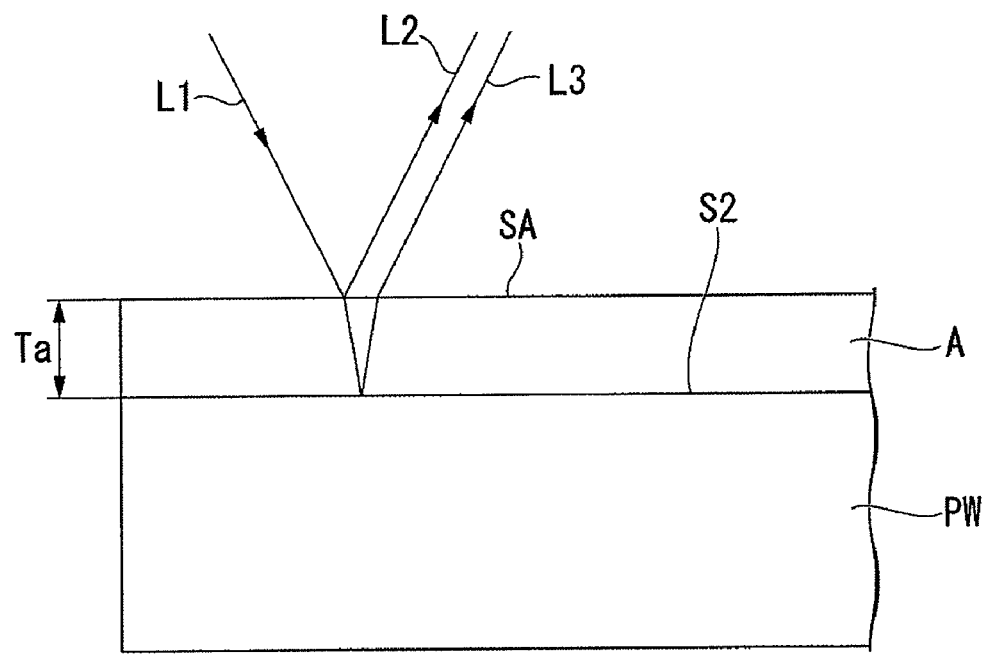
FIG. 3 is a schematic drawing for explaining an auxiliary film thickness measurement step S02 in FIG. 1.

Next, in the auxiliary film thickness measurement step S02, the film thickness of the auxiliary film A deposited in the auxiliary film formation step S01 is measured as shown in FIGS. 2C and 3.

FIG. 3 is a schematic drawing for explaining the auxiliary film thickness measurement step S02 by FTIR in the present embodiment.

In the auxiliary film thickness measurement step S02, the back surface S2 of the polished wafer PW having the auxiliary film A is irradiated with infrared light L1, reflected light L2 reflected at the surface SA of the auxiliary film A and reflected light L3 reflected at the interface (boundary) S2 between the auxiliary film A and the substrate PW are guided to a detector (not shown), and the film thickness Ta of the auxiliary film A is detected by measuring the difference in the light paths thereof. Although measurement of film thickness of the auxiliary film A at this time is only carried out at the peripheral edge F of a wafer W as will be described later, it may also be carried out at the same time as other inspections and the like, or may be carried out over the entire surface of the wafer W or over a large portion thereof that includes the peripheral edge F.

Film thickness Ta data output from the detector is managed either by, for example, being formed in the wafer W in the form of laser markings and the like or within a wafer processing flow control device, and is stored in a storage means not shown together with a serial number for identifying the wafer W.

Figure 2D:
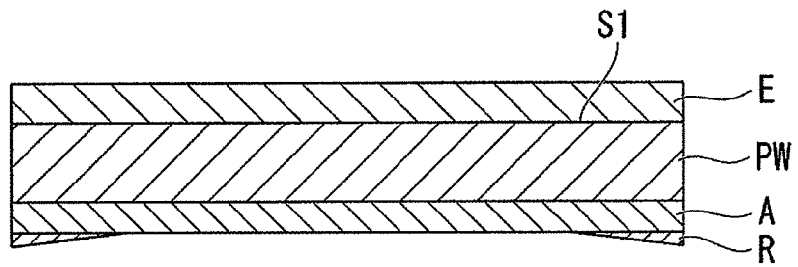

Next, in the front surface epitaxial layer deposition step S03, the polished wafer PW is inverted and the epitaxial layer E serving as a device region is deposited on the surface S1 thereof as shown in FIG. 2D.

Although this epitaxial layer E contains impurities of the same type as the polished wafer PW, for example, it is formed in compliance with epitaxial wafer specifications as the finished product. Thus, the previously described impurity concentration of the auxiliary film A is set to be nearly equal to the impurity concentration of this epitaxial layer E.

In the present embodiment, the impurity concentration of the epitaxial layer E can be of the p-type doped to a low concentration of, for example, about $1 \times 10^{15}$ atoms/cm$^3$ or less. Here, "p-type" refers to that in which the boron concentration is about $10^{15}$ atoms/cm$^3$ and the resistance value is 0.1 (mΩ·cm) or more.

In addition, the film thickness of the epitaxial layer E formed in the front surface epitaxial layer deposition step S03 is, for example, about 2 to 10 μm, and in order to achieve this film thickness, raw material gas in the form of trichlorosilane and dopant gas in the form of diborane ($B_2H_6$) are passed over the surface S1 of the polished wafer PW for a prescribed amount of time together with a carrier gas in the form of hydrogen at a heating temperature of 1130° C. in a batch-type single-wafer epitaxial reactor.

In the front surface epitaxial layer deposition step S03, the back surface deposit R may be formed on the auxiliary film A on the back surface S2 of the polished wafer PW as a result of the raw material gas circulating to the back surface during deposition of the epitaxial layer E.

Figure 2E:
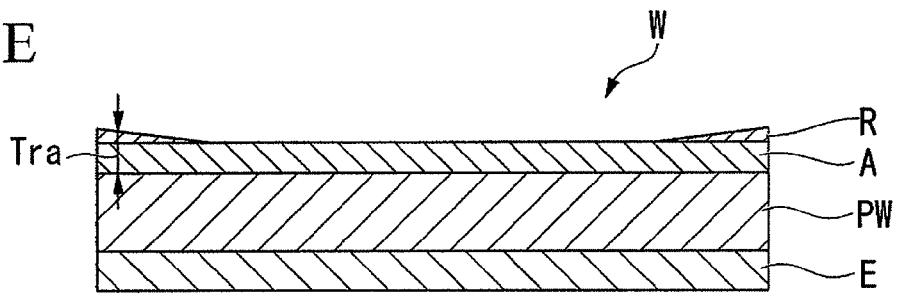
Figure 4:
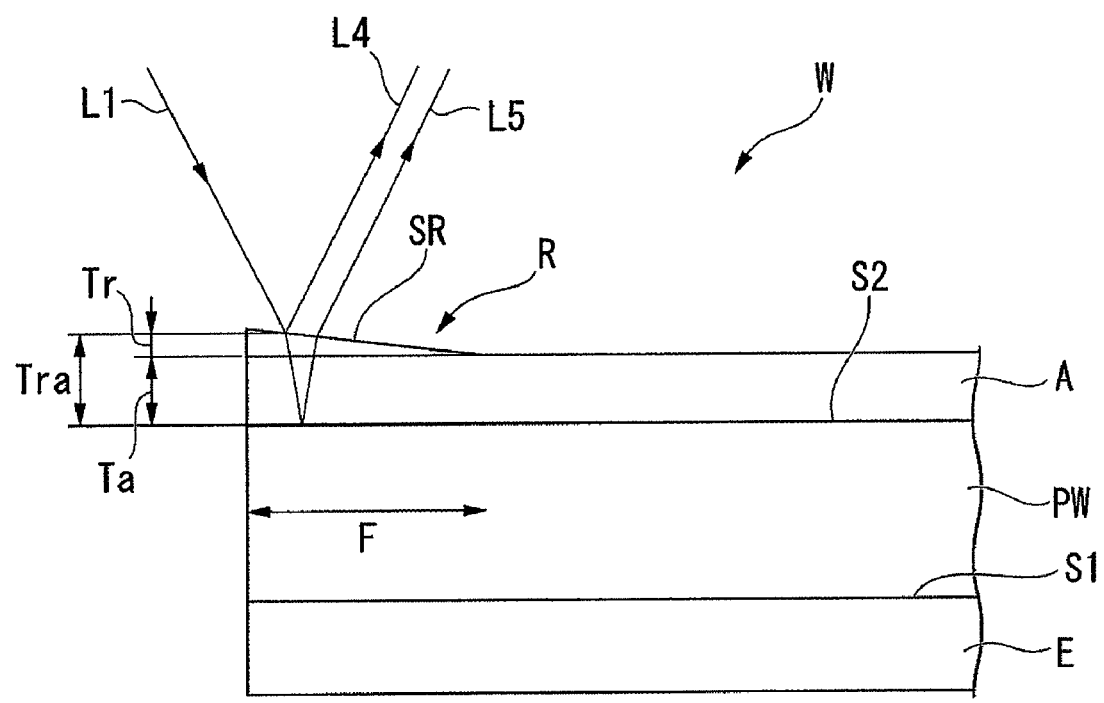
FIG. 4 is a schematic drawing for explaining a measurement step S04 in FIG. 1.

Next, in the measurement step S04, the film thicknesses of the back surface deposit R and the auxiliary film A formed in the front surface epitaxial layer deposition step S03 are measured by FTIR in the form of the combined film thickness Tra as shown in FIGS. 2E and 4.

FIG. 4 is a schematic drawing for explaining the measurement step S04 using the FTIR method in the present embodiment.

In the measurement step S04, after having inverted the epitaxial wafer (wafer) W in which the epitaxial layer E is formed on the surface S1 so that the back surface S2 is facing upward to enable measurement, infrared light L1 is radiated onto the wafer peripheral edge F where the back surface deposit R has formed on the wafer W as shown in FIGS. 2E and 4, reflected light L4 reflected at the surface SR of the back surface deposit R on the auxiliary film A and reflected light L5 reflected at the interface (boundary) S2 between the auxiliary film A and the substrate PW are guided to a detector (not shown), and the film thickness Ta of the auxiliary film A and the film thickness Tr of the back surface deposit R are detected in the form of the combined film thickness Tra by measuring the difference in the light paths thereof.

Here, since the impurity concentrations of the auxiliary film A and the epitaxial layer E are set to be nearly equal, the state results in that there is no difference between the impurity concentrations of the auxiliary film A and the back surface deposit R, or in other words, a so-called "undetectable" state with the FTIR method, and infrared light for detection is not reflected at the interface between the auxiliary film A and the back surface deposit R. Thus, the combined film thickness Tra of the auxiliary film and the back surface deposit R can be measured.

Combined film thickness Tra data output from the detector is managed either by, for example, being formed in the wafer W in the form of laser markings and the like or within a wafer processing flow control device, and is stored in a storage means not shown together with a serial number for identifying the wafer W.

Figure 7:
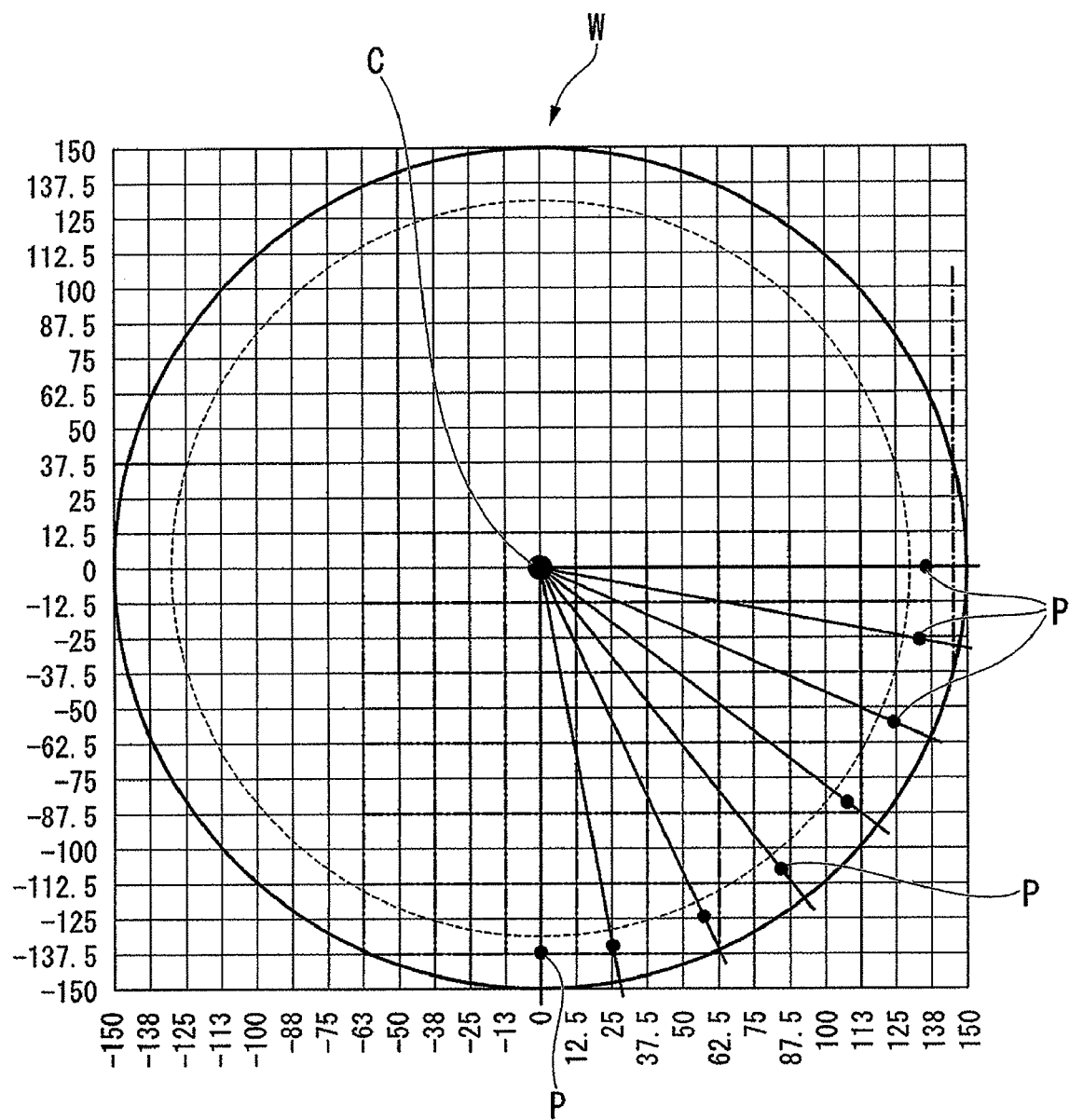
FIG. 7 is a schematic drawing for explaining a measurement point P in the measurement step S04 in one example of the present invention.

Measurement in the measurement step S04 is carried out at the peripheral edge F of the wafer W where there is the possibility of formation of the back surface deposit R as shown in FIGS. 4 and 7. As indicated by the area outside the broken line in FIG. 7, the peripheral edge F is only within the range of 1 to 10 mm in the direction of diameter from the peripheral edge.

In addition, measurement within this peripheral edge F is carried out for each of a plurality of measurement points P over the entire circumference of the wafer in the circumferential direction thereof. Furthermore, measurement points P are only shown in the lower right quarter of the circle in FIG. 7.

As shown in FIG. 7, the central angle pitch is set to 15° so that the central angle relative to the wafer center C is 15° along the wafer peripheral edge F. As a result, in an epitaxial wafer having a diameter of 300 mm, together with it being possible to measure the back surface deposit R required at locations corresponding to each device for an epitaxial wafer W for producing devices measuring 20 to 30 mm on a side and preferably 25 mm on a side, complexity of the measurement work can be reduced and the amount of work time required for measurement can be shortened.

Subsequently, in the calculation step S05, the film thickness Ta of the auxiliary film A and the combined film thickness Tra are read from the storage means by a control means, and the difference between the combined film thickness Tra and the film thickness Ta of the auxiliary film A is calculated as the film thickness Tr of the back surface deposit R. Namely, the film thickness Tr of the back surface deposit R is calculated using formula (1) shown below.

$$Tr = Tra - Ta \quad (1)$$

In the evaluation step S06, the acceptability of the epitaxial wafer W is evaluated according to the film thickness Tr of the back surface deposit R obtained in the calculation step S05, namely the change in film thickness.

Here, although the value of the film thickness Tr used for the evaluation criterion can be set within a range of 0.01 to 0.2 μm, this is determined in compliance with the specifications of the epitaxial wafer W as the finished product.

For example, the evaluation criterion can be set such that the epitaxial wafer W is evaluated as being unacceptable if the film thickness Tr of the back surface deposit R is 0.55 μm or more and acceptable if it is less than that value, or more preferably, the epitaxial wafer W is evaluated as being unacceptable if the film thickness Tr of the back surface deposit R is 0.02 μm or more, and acceptable if it is less than that value.

In this evaluation step S06, epitaxial wafers W that have been produced are evaluated, and those that have been evaluated as being unacceptable are removed from the production line.

As a result, epitaxial wafers W can be produced in which the effects of back surface deposits have been reduced.

EXAMPLES

The following provides an explanation of examples as claimed in the present invention.

In the present embodiment, a double-sided polished wafer (polished wafer) PW of the p+ type or p++ type was prepared having an impurity (and more specifically, boron) concentration of $1 \times 10^{17}$ atoms/cm$^3$, and the thickness of a back surface deposit was measured using the process described below.

(1) An auxiliary film A having an impurity (and more specifically, boron) concentration of $1 \times 10^{15}$ atoms/cm$^3$ and target film thickness of 2 μm was formed by epitaxial growth on the back surface S2 of the polished wafer PW.

(2) As a result of measuring the film thickness Ta of the auxiliary film A by FTIR, the film thickness was found to be 2.01 μm.

(3) The polished wafer PW was then inverted so that the surface S1 opposite from the back surface S2 on which the auxiliary film A had been grown was the growth side.

(4) An epitaxial growth layer E having an impurity (and more specifically, boron) concentration of $1 \times 10^{15}$ atoms/cm$^3$ and target film thickness of 2 μm was formed by epitaxial growth on the surface of the inverted polished wafer PW.

(5) As a result of again measuring the combined film thickness Tra of the auxiliary film A grown on the back surface S2 and the back surface deposit R by FTIR, the combined film thickness was found to be 2.04 μm.

(6) The film thickness Tr of the back surface deposit R was then calculated to be Tra−Ta=0.03 μm from the aforementioned formula (1).

On the basis of the above results, film thickness of a back surface deposit R of 0.3 μm or less was determined to be able to be measured accurately. In addition, acceptability of the epitaxial wafer W was able to be evaluated based on the change in wafer thickness caused by presence of the back surface deposit R.

Figure 5:
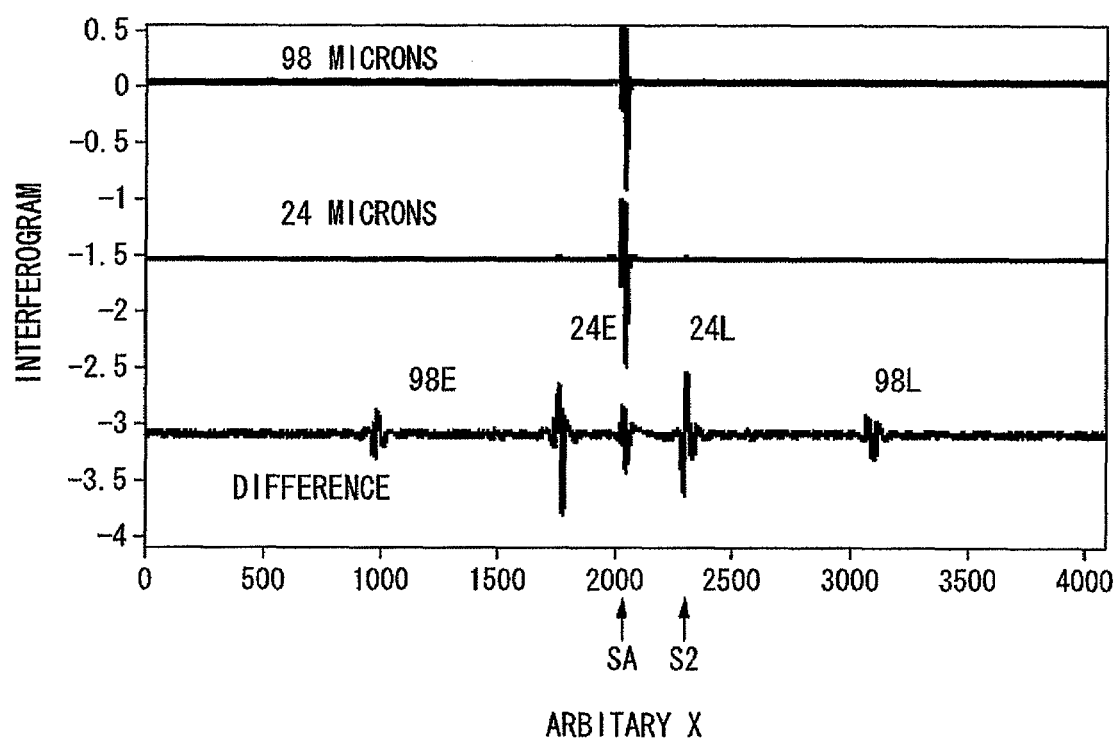
FIG. 5 is a graph showing the results of measuring film thickness by the FTIR method in the present invention.
Figure 6:
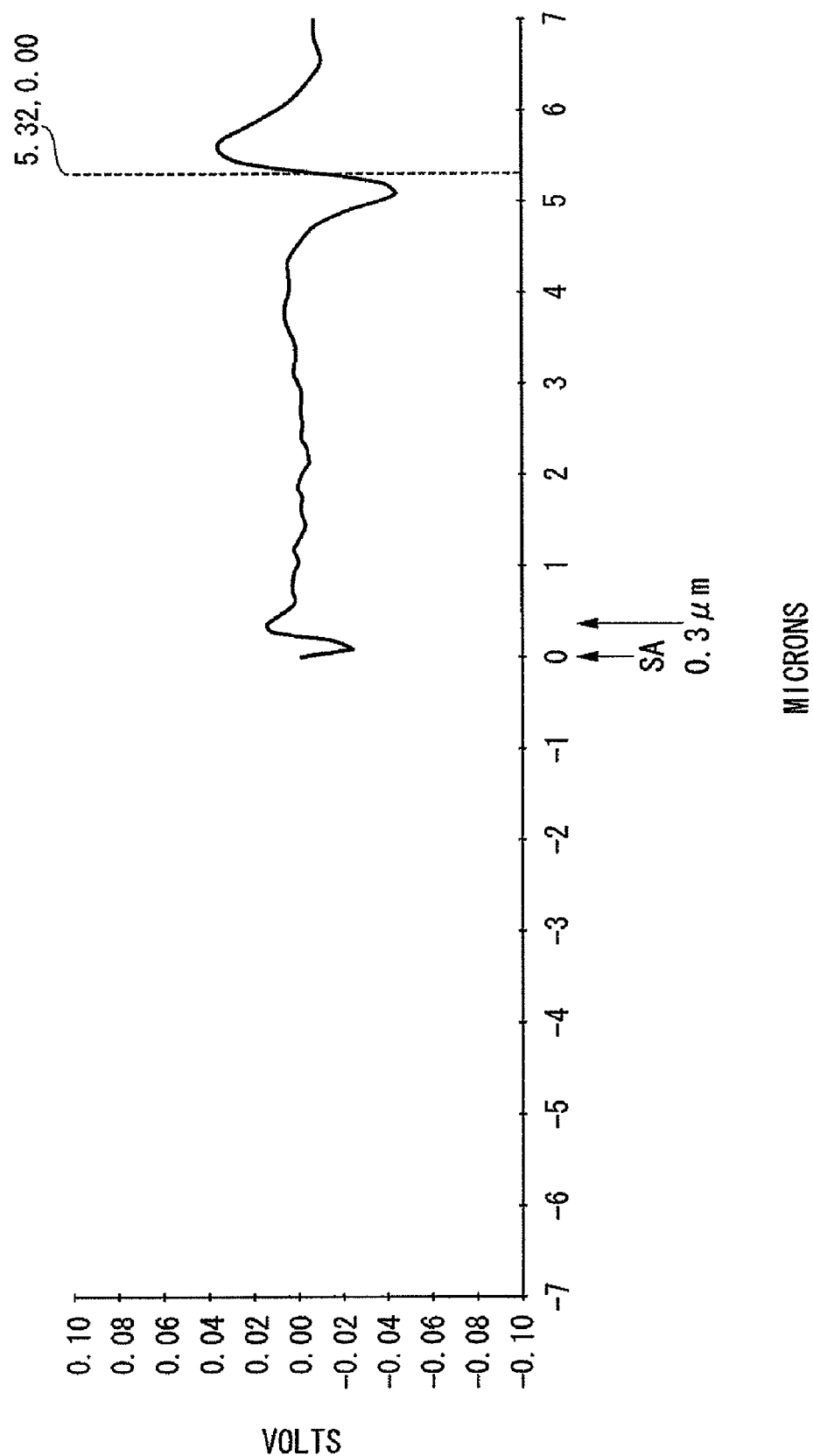
FIG. 6 is a graph showing the results of measuring film thickness by the FTIR method in the present invention.

In contrast, film thickness of 0.3 μm or less was determined to be unable to be measured accurately due to disturbances in the detection signal as shown in FIGS. 5 and 6.

Here, FIG. 5 shows an interferogram of various film thicknesses, with reflection intensity plotted on the vertical axis and arbitrary values plotted on the horizontal axis.

In addition, FIG. 6 shows an interferogram for a film thickness of 5.32 μm, with reflection intensity plotted on the vertical axis and film thickness plotted on the horizontal axis.

The invention claimed is:

1. A film thickness measurement method for measuring a change in film thickness of 0.3 μm or less in a silicon wafer by FTIR, comprising:
    an auxiliary film formation step for depositing an auxiliary film for measurement of a prescribed film thickness on a side to be measured for the change in film thickness;
    an auxiliary film thickness measurement step for measuring the film thickness of the auxiliary film;
    a measurement step for measuring the film thickness of the auxiliary film after the change in film thickness; and
    a calculation step for calculating a change in film thickness from the result of the measurement step and the result of the auxiliary film thickness measurement step.

2. The film thickness measurement method according to claim 1, wherein the change in film thickness measured in the measurement step is a change in film thickness caused by a back surface deposit on the back surface of a wafer in a front surface epitaxial layer formation step in which an epitaxial layer is formed on the front surface of the wafer during production of an epitaxial wafer.

3. An epitaxial wafer production process in which an epitaxial layer is deposited on the front surface of a wafer, comprising:
    an auxiliary film formation step for depositing an auxiliary film for measurement of a prescribed film thickness on the back surface of the wafer;
    an auxiliary film thickness measurement step for measuring the film thickness of the auxiliary film by FTIR;
    a front surface epitaxial layer deposition step for depositing an epitaxial layer on the front surface of the wafer;
    a measurement step for measuring the film thickness of the auxiliary film caused by a back surface deposit on the auxiliary film by FTIR after the front surface epitaxial layer deposition step; and
    a calculation step for calculating a change in film thickness of 0.3 μm or less caused by the back surface deposit from the result of the measurement step and the result of the auxiliary film thickness measurement step.

4. The epitaxial wafer production process according to claim 3, wherein measurement of a change in film thickness in the measurement step is only carried out at the peripheral edge of the wafer over a range of 1 to 10 mm in the direction of diameter from the peripheral edge.

5. The epitaxial wafer production process according to claim 4, wherein measurement of a change in film thickness in the measurement step is carried out in the circumferential direction of the wafer at a central angle pitch of 15°.

6. An epitaxial wafer production process having an evaluation step for evaluating the acceptability of epitaxial wafers according to a change in film thickness caused by a back surface deposit obtained by the epitaxial wafer production process according to claim 3.

7. An epitaxial wafer production process having an evaluation step for evaluating the acceptability of epitaxial wafers according to a change in film thickness caused by a back surface deposit obtained by the epitaxial wafer production process according to claim 4.

8. An epitaxial wafer production process having an evaluation step for evaluating the acceptability of epitaxial wafers according to a change in film thickness caused by a back surface deposit obtained by the epitaxial wafer production process according to claim 5.

\* \* \* \* \*